United States Patent
Lim et al.

(10) Patent No.: US 11,569,097 B2
(45) Date of Patent: Jan. 31, 2023

(54) RESIN MOLDING APPARATUS INCLUDING RELEASE FILM FEEDER

(71) Applicant: Samsung Electronics Co., Ltd., Suwon-si (KR)

(72) Inventors: Chae-hun Lim, Seoul (KR); Kun-sil Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 954 days.

(21) Appl. No.: 16/257,305

(22) Filed: Jan. 25, 2019

(65) Prior Publication Data
US 2020/0027756 A1    Jan. 23, 2020

(30) Foreign Application Priority Data

Jul. 23, 2018 (KR) .......................... 10-2018-0085379

(51) Int. Cl.
*H01L 21/56* (2006.01)
*H01L 21/687* (2006.01)
(Continued)

(52) U.S. Cl.
CPC ...... *H01L 21/566* (2013.01); *H01L 21/67126* (2013.01); *H01L 21/67253* (2013.01);
(Continued)

(58) Field of Classification Search
CPC ............. H01L 21/566; H01L 21/67126; H01L 21/67253; H01L 21/67259;
(Continued)

(56) References Cited

U.S. PATENT DOCUMENTS 5,891,483 A    4/1999 Miyajima
2002/0139485 A1  10/2002 Sasaki
(Continued)

FOREIGN PATENT DOCUMENTS

CN    101910924 A    12/2010
CN    102971127 A    3/2013
(Continued)

OTHER PUBLICATIONS

Notice of Allowance for Korean Application No. 10-2018-0085379 dated Dec. 6, 2022.

*Primary Examiner* — Syed I Gheyas
(74) *Attorney, Agent, or Firm* — Harness, Dickey & Pierce, P.L.C.

(57) ABSTRACT

A resin molding apparatus including a release film feeder configured to feed a release film is provided. The release film feeder including a feeding roller around which the release film is wound, a gripper configured to grip an end portion of the release film fed from the feeding roller, a support table configured to support the release film fed by a horizontal movement of the gripper in an X direction, the support table configured to horizontally move at least one of in the X direction or in a Y direction perpendicular to the X direction, the X and Y directions defining a surface parallel to a surface of the support table, and a position detecting sensor on the support table and configured to detect position information of the release film may be provided.

20 Claims, 18 Drawing Sheets

(51) Int. Cl.
*H01L 21/67* (2006.01)
*H01L 21/677* (2006.01)

(52) U.S. Cl.
CPC .. *H01L 21/67259* (2013.01); *H01L 21/67706* (2013.01); *H01L 21/68707* (2013.01)

(58) Field of Classification Search
CPC ........... H01L 21/68707; B29C 37/0075; B29C 33/68; B29C 39/24; B29C 39/44; B29C 2037/90
See application file for complete search history.

(56) References Cited

U.S. PATENT DOCUMENTS

| | | |
|---|---|---|
| 2007/0119543 A1 | 5/2007 | Ametani |
| 2012/0160420 A1 | 6/2012 | Kimura et al. |
| 2013/0334727 A1 | 12/2013 | Mine et al. |
| 2016/0368177 A1 | 12/2016 | Kasai et al. |
| 2017/0207105 A1 | 7/2017 | Kasai et al. |

FOREIGN PATENT DOCUMENTS

| | | |
|---|---|---|
| CN | 104708752 A | 6/2015 |
| CN | 108352331 A | 7/2018 |
| EP | 1198989 A1 | 4/2002 |
| JP | H0239919 A | 2/1990 |
| JP | H07300120 A | 11/1995 |
| JP | 2001-217269 A | 8/2001 |
| JP | 2001-220032 A | 8/2001 |
| JP | 2001-310382 A | 11/2001 |
| JP | 2002154132 A * | 5/2002 |
| JP | 2004-148621 A | 5/2004 |
| JP | 2012-016883 A | 1/2012 |
| JP | 2014-000696 A | 1/2014 |
| JP | 2015-101083 A | 6/2015 |
| KR | 10-0221110 B1 | 9/1999 |
| KR | 10-2010-0011124 A | 2/2010 |
| KR | 10-2010-0110059 A | 10/2010 |
| KR | 10-2014-0007287 A | 1/2014 |
| KR | 10-1400676 B1 | 5/2014 |
| KR | 10-1515720 | 4/2015 |
| KR | 10-1753695 | 7/2017 |

* cited by examiner

RESIN MOLDING APPARATUS INCLUDING RELEASE FILM FEEDER

CROSS-REFERENCE TO RELATED APPLICATION

This application claims the benefit of priority under 35 U.S.C. § 119 to Korean Patent Application No. 10-2018-0085379, filed on Jul. 23, 2018, in the Korean Intellectual Property Office, the disclosure of which is incorporated herein in its entirety by reference.

BACKGROUND

The inventive concepts relate to resin molding apparatuses, and more particularly, to resin molding apparatuses including a release film feeding apparatus.

A resin molding apparatus may perform a molding process of injecting a molding resin (e.g., an epoxy resin) into a cavity of upper and lower molds in which a chip type element (e.g., a transistor, an integrated circuit, or a light emitting diode) is disposed. The resin molding apparatus may include a release film feeding apparatus for coating a release film on a surface of the cavity of the upper and lower molds to easily separate the molded chip type element from the upper and lower molds after performing the molding process. It is desired that the release film feeding apparatus feed a release film, in which a defect is reduced or suppressed, at an accurate position in the upper and lower molds.

SUMMARY

At least one of the example embodiment of inventive concepts provide resin molding apparatuses including a release film feeding apparatus for feeding a release film, in which a defect is reduced or suppressed, at an accurate position in upper and lower molds.

According to an example embodiment of the inventive concepts, a resin molding apparatus including a release film feeder configured to feed a release film, the release film feeding apparatus includes a feeding roller around which the release film is wound, a gripper configured to grip an end portion of the release film fed from the feeding roller, a support table configured to support the release film fed by a horizontal movement of the gripper in an X direction, the support table configured to horizontally move in at least one of the X direction or in a Y direction perpendicular to the X direction, the X and Y directions defining a surface parallel to a surface of the support table, and a position detecting sensor on the support table and configured to detect position information of the release film.

According to an example embodiment of the inventive concepts, a resin molding apparatus comprising a release film feeder configured to feed a release film, which includes a feeding roller around which the release film is wound, the release film having a multilayer structure including a stack of a release function layer and a plurality of auxiliary film layers spaced apart from each other at regular intervals on the release function layer, a gripper configured to grip an end portion of the release film fed from the feeding roller, a support table configured to support the release film fed by a horizontal movement of the gripper in an X direction, the support table configured to horizontally move in at least one of the X direction or in a Y direction perpendicular to the X direction, the X and Y directions defining a surface parallel to a surface of the support table, and a position detecting sensor on the support table, the position detecting sensor configured to detect positions of the plurality of auxiliary film layers.

According to an example embodiment of the inventive concepts, a resin molding apparatus includes a resin material feeder configured to feed a resin to a chip type element on a substrate, the resin material feeder including a release film feeding mechanism including a support table and configured to feed a release film onto the support table, a resin material receiving frame, and a resin material conveying mechanism, the support table configured to horizontally move in X and Y directions that are parallel to a surface of the support table, the resin material receiving frame to which the release film is attached and configured to receive a resin material, the resin material conveying mechanism configured to convey the resin material receiving frame having the release film attached thereto to a mold, the mold including an upper mold part and a lower mold part, the mold configured to receive the resin between the upper mold part and the lower mold part and mold the chip type element on the substrate, a position detecting sensor configured to detect a position of the release film, the position detecting sensor on the support table, and a controller configured to control the resin material feeder and the mold.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

While the term "same" is used in description of example embodiments, it should be understood that some imprecisions may exist. Thus, when one element is referred to as being the same as another element, it should be understood that the one element is the same as another element within a desired manufacturing tolerance range (e.g., ±10%).

When the terms "about" or "substantially" are used in this specification in connection with a numerical value, it is intended that the associated numerical value include a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

A resin molding apparatus for performing a molding process on chip type elements may use a transfer molding method of injecting a molten or liquid resin material into a cavity of a mold and a compression molding method of feeding a resin material into a cavity and compressing and molding the resin material between an upper mold and a lower mold.

Further, the resin molding apparatus may include a release film feeding apparatus for coating a release film on a surface of a cavity of upper and lower molds to easily separate a molded chip type element from the upper and lower molds after performing a molding process. Hereinafter, a release film feeding apparatus is used in a compression molding type resin molding apparatus, but the release film feeding apparatus of the inventive concept may also be used for a transfer molding type resin molding apparatus.

Figure 1:
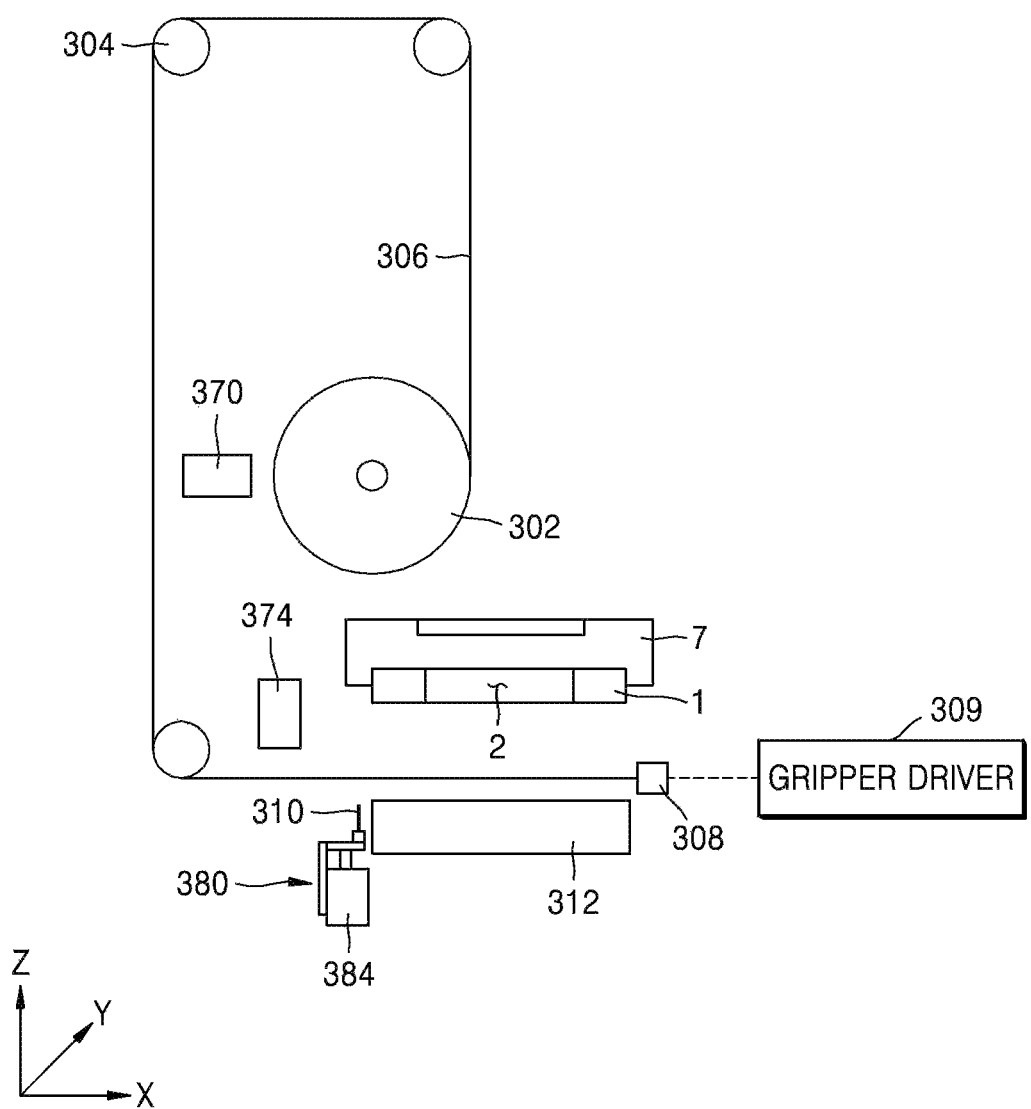
FIG. 1 is a schematic view for explaining a release film feeding apparatus according to an example embodiment of the inventive concepts.
Figure 2:
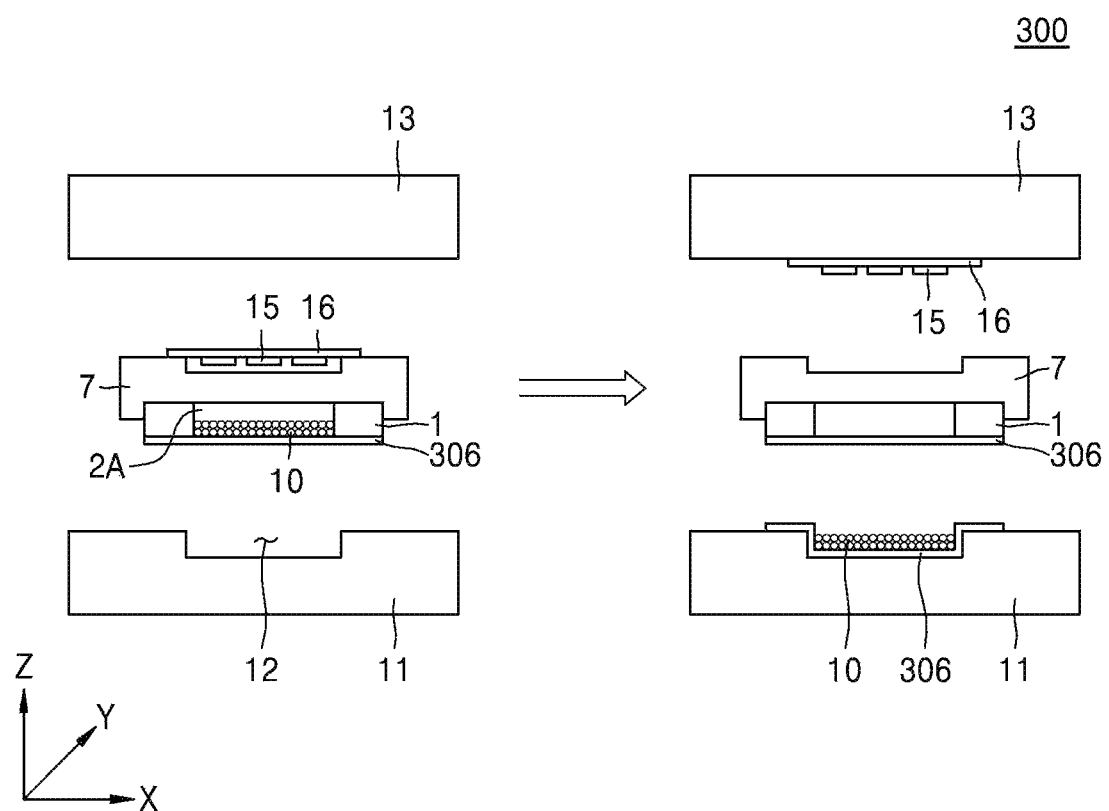
FIG. 2 is a view showing a resin molding apparatus including the release film feeding apparatus shown in FIG. 1 and showing a molding method using the resin molding apparatus.

FIG. 1 is a schematic view for explaining a release film feeder 50 according to an example embodiment of the inventive concepts. FIG. 2 is a view showing a resin molding apparatus 300 including the release film feeder 50 shown in FIG. 1 and showing a molding method using the resin molding apparatus. For brevity's sake, only a portion of the release film feeder 50 is shown in FIG. 2.

For example, the release film feeder 50 may feed a release film 306 to the resin molding apparatus 300 to perform a molding process on chip type elements 15 mounted on a substrate 16, as shown in FIG. 2. One example configuration of the resin molding apparatus 300 for performing the molding process will be described later in more detail.

Referring to FIGS. 1 and 2, the release film feeder 50 may feed a release film 306 to a mold 11. For example, the molds 11 and 13 may include a lower mold 11 having a cavity 12 and an upper mold 13 supporting the substrate 16. The release film 306 may be used to coat the cavity 12 of the lower mold 11.

Referring to FIG. 1, the release film feeder 50 may include a feeding roller 302 on which the release film 306 is wound. The release film 306 may be cut to a desired (or alternatively, predetermined) size as shown in FIG. 2, and may be fed to a space between the lower mold 11 and the upper mold 13 by a resin material receiving frame 1. The release film 306 may be moved along a feeding path (not specifically illustrated) set between the feeding roller 302 and the resin material receiving frame 1 and may be guided by at least one guide roller 304.

Referring to FIG. 1, three guide rollers 304 may be used for guiding the release film 306. However, the number of feeding paths of the release film 306 and/or the number of the guide rollers 304 may be variously changed. Therefore, example embodiments of the inventive concepts are not limited thereto. The method of feeding the release film 306 will be described later in detail.

The release film feeder 50 may include a consumption amount measuring sensor 370, which is disposed adjacent to the feeding roller 302 and measures a consumption amount of the release film 306. The consumption amount measuring sensor 370 may be an optical sensor, for example, a color sensor. For example, a color of the wound release film 306 may change according to the consumption amount of the release film 306. Thus, the consumption amount measuring sensor 370 may determine the consumption amount of the release film 306 by measuring the color of the release film 306.

The configuration illustrated in FIG. 1 except for the resin material receiving frame 1 and the resin material conveying mechanism 7 may be collectively referred to as a release film feeding mechanism.

The resin molding apparatus 300 including the release film feeder 50 may include the resin material receiving frame 1 for conveying the release film 306 to the molds 11 and 13. The resin material receiving frame 1 may be referred to as a tray. The resin material receiving frame 1 may have a substantially square plate shape having an opening 2 in a central portion thereof, and may include vacuum holes (not shown) for adsorbing the release film 306 in a lower surface thereof.

The release film 306 may be guided to a position adjacent to the resin material receiving frame 1 by the guide rollers 304. The release film feeder 50 may include a gripper 308 for gripping an end portion of the release film 306, which has been guided to the position adjacent to the resin material receiving frame 1, and a gripper driver 309 for moving the gripper 308 in a horizontal direction such that the release film 306 is positioned between a lower portion of the resin material receiving frame 1 and an upper portion of a support table 312. The gripper 308 may also be referred to as a clamper.

A gripping operation of the gripper 308 may be performed using an electromagnet or the like. A pneumatic cylinder may be used as the gripper driver 309. However, example embodiments of the inventive concepts are not limited thereto. Detailed configurations of the gripper driver 309 for performing the gripping operation in association with the gripper 308 may be variously changed.

The release film feeder 50 may include the support table 312 for supporting the release film 306, which has been moved in the horizontal direction by the gripper 308. The support table 312 may move in the horizontal direction(s) with respect to a surface of the support table 312 (e.g., in an X direction on the surface of the support table 312, and/or in a Y direction horizontally perpendicular to the X direction). The support table 312 may move vertically with respect to the surface of the support table 312 (e.g., in a Z direction perpendicular to both X and Y directions), and may be sufficiently close to the release film 306 on the lower surface of the resin material receiving frame 1.

The support table 312 may include a position detecting sensor (e.g. first and second position detecting sensors 402 and 404 illustrated in FIG. 6B) for detecting X-direction and Y-direction positions of the release film 306 as will be described later. The position detecting sensor will be described later in detail.

The release film feeder 50 may include a cutting unit 380 disposed adjacent to the resin material receiving frame 1 to cut the release film 306 after the release film 306 is adsorbed on the lower surface of the resin material receiving frame 1. For example, the cutting unit 380 may include a blade 310 for cutting the release film 306 and a blade driver 384 for moving the blade 310. The blade driver 384 may be, for example, a pneumatic cylinder.

The resin molding apparatus 300 including the release film feeder 50 may include a resin material conveying mechanism 7. The resin material conveying mechanism 7 may be referred to as a loader. The resin material receiving frame 1 may move in the vertical and horizontal directions with respect to the surface of the support table 312 by the resin material conveying mechanism 7. For example, a pneumatic cylinder may be used as a driver for moving the support table 312. For example, a robot may be used as a driver for moving the resin material conveying mechanism 7.

The release film feeder 50 may include a defect detecting sensor 374 for detecting whether the release film 306 is defective between the feeding roller 302 and the support table 312. For example, a color sensor may be used as the defect detecting sensor 374. The cutting unit 380 may cut the release film 306 that is defective. A cut portion of the release film 306 may be rejected.

The release film feeder 50 may include a marker (not shown) for marking the release film 306 with a reject mark indicating a defect in a manufacturing process or use. Further, the support table 312 may include a reject detecting sensor capable of detecting the reject mark on the release film 306. The reject mark and the reject detecting sensor will be described later in detail.

Here, a method of feeding the release film 306 by using the resin material receiving frame 1 will be described.

The release film 306 may be moved to the position adjacent to the resin material receiving frame 1 by the guide rollers 304. The end portion of the release film 306 may be gripped by the gripper 308. Then, the gripper 308 may be moved in the horizontal direction by the gripper driver 309 such that the release film 306 is positioned on the upper portion of the support table 312 or between the resin material receiving frame 1 and the support table 312. The release film 306 may be mounted on an accurate position using the position detecting sensor on the support table 312 when the release film is moved onto the upper portion of the support table 312.

When the release film 306 is positioned between the resin material receiving frame 1 and the support table 312, the support table 312 may rise to support the release film 306 and/or the resin material receiving frame 1 may drop to adsorb the release film 306.

The cutting unit 380 disposed adjacent to the support table 312 may cut the release film 306 by the blade 310 before or after the release film 306 is adsorbed to the lower surface of the resin material receiving frame 1. Accordingly, the release film 306 may be cut to a desired (or alternatively, predetermined) size and be in a state of being adsorbed on the lower surface of the resin material receiving frame 1. A horizontal movement process of the release film 306 by the gripper 308 and a cutting process of the release film 306 will be described later in more detail.

Next, a method of molding the chip type element 15 by conveying the resin material receiving frame 1 to the molds 11 and 13 will be described with reference to FIG. 2.

For example, the release film 306 adsorbed on the lower surface of the resin material receiving frame 1 may cover the opening 2 of the resin material receiving frame 1, and thus a resin material receiving portion 2A may be defined by the release film 306 in the resin material receiving frame 1. The resin material receiving portion 2A may be loaded with a resin material 10 (e.g., an epoxy molding compound (EMC)) for molding the chip type elements 15. For example, the resin material conveying mechanism 7 may move the resin material receiving frame 1 to a resin feeding apparatus (not shown). In the resin feeding apparatus, an appropriate amount of the resin material 10 may be loaded in the resin material receiving portion 2A.

The substrate 16 may be placed on the resin material conveying mechanism 7 after the resin material 10 is loaded. The resin material conveying mechanism 7 may move the resin material receiving frame 1 on which the substrate 16 and the resin material 10 are loaded between the upper mold 13 and the lower mold 11.

Subsequently, the substrate 16 may be loaded on the lower surface of the upper mold 13. The release film 306 and the resin material 10 may be loaded onto the lower mold 11. The upper mold 13 may be provided with vacuum holes (not shown) for adsorbing a back surface of the substrate 16. The lower mold 11 may be provided with vacuum holes (not shown) for adsorbing the release film 306. Thus, the release film 306 may be adsorbed to the lower mold 11 to cover the cavity 12 of the lower mold 11, and the resin material 10 may be fed into the cavity 12. Subsequently, after moving the resin material receiving frame 1 using the resin material conveying mechanism 7, the molding process may be performed by lowering the upper mold 13, on which the substrate 16 having a semiconductor element 15 on the lower surface thereof is attached, toward the lower mold 11 in which the resin material is formed. The resin molding apparatus 300 and the molding process using the resin molding apparatus 300 will be described later in more detail.

FIGS. 3A to 3D are schematic cross-sectional views for explaining a process of receiving a resin material in the resin material receiving frame 1 of the resin molding apparatus 300 shown in FIG. 2.

Figure 3A:
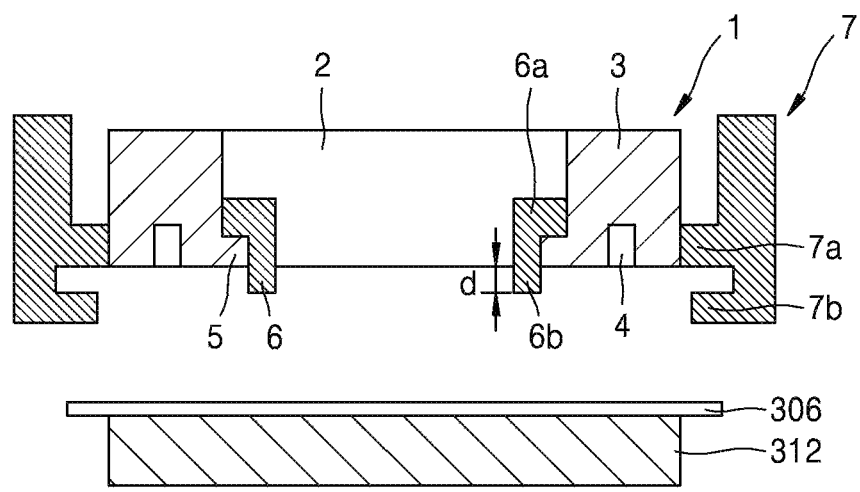
FIGS. 3A to 3D are schematic cross-sectional views for explaining a process of receiving a resin material in a resin material receiving frame of the resin molding apparatus shown in FIG. 2.

Referring to FIG. 3A, the resin material receiving frame 1 included in the resin molding apparatus 300 may have the opening 2 passing through upper and lower portions of the resin material receiving frame 1, a peripheral edge portion 3 formed around the opening 2, an adsorption groove 4 provided at a lower surface of the peripheral edge portion 3, a protruding portion 5 formed on a lower side surface of the peripheral edge portion 3 and protruding inwardly (or alternatively, protruding inwardly and horizontally), and an elevating member 6 elevating along an inner side surface of the peripheral edge portion 3. The release film 306 may be adsorbed on the lower surface of the peripheral edge portion 3.

The elevating member 6 may have an inverted L-shape. The elevating member 6 may have a horizontal portion 6a extending in a horizontal direction and a vertical portion 6b extending in a vertical direction. The elevating member 6 may fall by its own weight. The elevating member 6 may be stopped when a lower surface of the horizontal portion 6a of the elevating member 6 comes into contact with an upper surface of the protruding portion 5 formed on the peripheral edge portion 3. The protruding portion 5 formed on the lower side surface of the peripheral edge portion 3 may serve as a stopper for stopping the elevating member 6 from falling due to its own weight.

The protruding portion 5 may maintain stopping of the fall of the elevating member 6. The lower surface of the vertical portion 6b of the elevating member 6 may protrude downward by a distance d with respect to the lower surface of the peripheral edge portion 3, in a state where the elevating member 6 is stopped. The distance d may be determined according to, for example, an amount of resin to be fed and/or a hardness of the release film 306, may be set to about 0.5 mm to about 2 mm.

The peripheral edge portion 3 may include a metal (e.g., aluminum). The elevating member 6 may include a material having wear resistance, for example, a metal material such as stainless steel or chrome steel, or a ceramics material, to mitigate or prevent a bottom surface of the vertical portion 6b from being worn. Synthetic rubber (not shown) may be embedded in the lower surface of the peripheral edge portion 3 to form the adsorption groove 4 in the synthetic rubber. By embedding the synthetic rubber, the adhesion of the lower surface of the peripheral edge portion 3 may be improved. For example, the synthetic rubber may include heat-resistant silicone rubber or fluorine rubber.

The resin material conveying mechanism 7 included in the resin molding apparatus 300 may be a conveying mechanism for moving the resin material receiving frame 1. The resin material conveying mechanism 7 may include a first holding portion 7a and a second holding portion 7b connected to the first holding portion 7a, and hold the resin material receiving frame 1 sandwiched therebetween in a transverse direction. The resin material conveying mechanism 7 may be capable of elevating. When the resin material receiving frame 1 is moved by the resin material conveying mechanism 7, the lower surface of the horizontal portion 6a of the elevating member 6 may be in contact with the upper surface of the protruding portion 5, and thus the elevating member 6 may be stopped. The lower surface of the vertical portion 6b of the elevating member 6 may be dropped (e.g., may protrude downwardly) by the distance d from the lower surface of the peripheral edge portion 3.

As shown in FIG. 3A, firstly, the rectangular release film 306 fed from a release film feeding apparatus 300 may be placed on the support table 312 to prevent the rectangular release film 306 from creasing or loosening. After the release film 306 is placed, the release film 306 may be adsorbed on the support table 312 by an adsorption mechanism (not shown). The release film 306 may be cut off while leaving only a desired portion of the adsorbed release film 306. In FIG. 3A, the release film 306 slightly larger than the support table 312 may be cut off.

Next, the resin material receiving frame 1 may be moved to an upper surface of the support table 8 to stop the resin material receiving frame 1 by using the resin material conveying mechanism 7. The elevating member 6 may be stopped when the lower surface of the horizontal portion 6a of the elevating member 6 comes into contact with the upper surface of the protruding portion 5 while the resin material receiving frame 1 is being moved. The lower surface of the vertical portion 6b of the elevating member 6 may be dropped (or protrude downwardly) by the distance d from the lower surface of the peripheral edge portion 3.

Figure 3B:
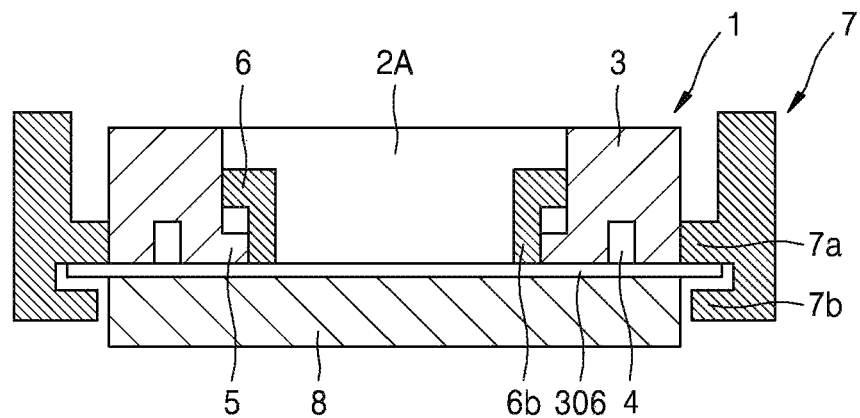

The resin material receiving frame 1 may be dropped and placed on the release film 306 adsorbed on the support table 312 as shown in FIG. 3B. In this process, the lower surface of the vertical portion 6b of the elevating member 6 which is dropped by the distance d from the lower surface of the peripheral edge portion 3 may be firstly into contact with the release film 306. Further, by dropping the resin material receiving frame 1, the elevating member 6 may be elevated along the inner side surface of the peripheral edge portion 3 by the reaction from the support table 312. The resin material receiving frame 1 may be dropped such that and the lower surface of the peripheral edge portion 3 comes into contact with the release film 306. In this state, the elevating member 6 may be elevated by the distance d from the surface of the release film 306. The lower surface of the elevating member 6 and the lower surface of the peripheral edge portion 3 may contact the release film 306, and thus the resin material receiving frame 1 may be disposed on the release film 306.

A lower portion of the opening 2 may be closed by the release film 306 in a state where the resin material receiving frame 1 is disposed on the release film 306. Accordingly, the resin material receiving frame 1 and the release film 306 may be integrated and thus the opening 2 may function as the resin material receiving portion 2A for receiving the resin material. The opening 2 surrounded by the elevating member 6 on the release film 306 may be referred to as the resin material receiving portion 2A. In other words, a space surrounded by the upper surface of the release film 306 and the inner side surface of the elevating member 6 may be the resin material receiving portion 2A.

Figure 3C:
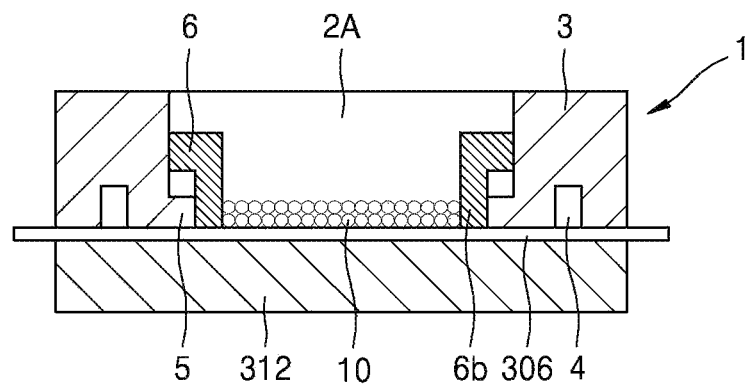

As shown in FIG. 3C, a desired (or alternatively, predetermined) amount of the resin material 10 may be injected into the resin material receiving portion 2A from a resin material feeding mechanism (not shown). The resin material 10 may include, for example, a granular type resin, a powdery type resin, a paste type resin, or a resin that is liquid at normal temperature (a liquid resin). When the liquid resin is used, the liquid resin may be discharged to the resin material receiving portion 2A by a dispenser. In the present embodiment, a case where the granular resin (a granule resin) is used as the resin material 10 will be described.

Figure 3D:
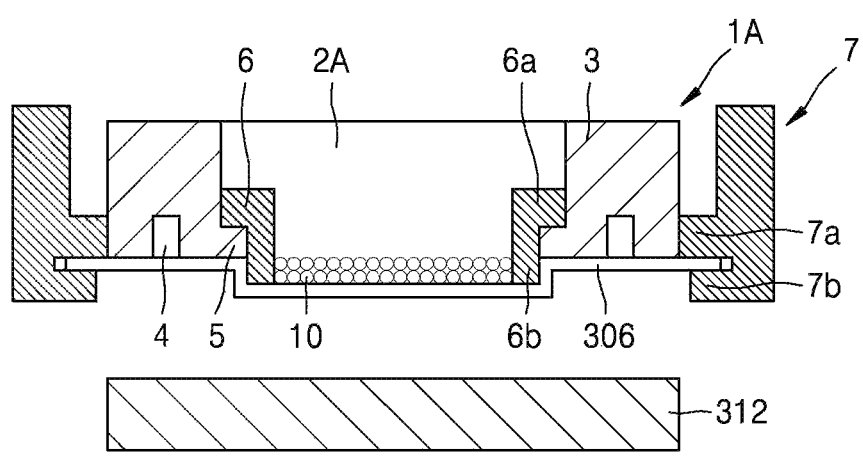

Next, as shown in FIG. 3D, the support table 8 may release the release film 306. Thereafter, the release film 306 may be adsorbed on the lower surface of the peripheral edge portion 3 by using the adsorption groove 4 provided in the resin material receiving frame 1. The peripheral edge portion 3 of the release film 306 may be sandwiched between the first holding portion 7a and the second holding portion 7b, and may be held by lifting the second holding portion 7b provided in the resin material conveying mechanism 7. In this state, the resin material receiving frame 1 and the release film 306 may be integrated. As described above, a component in which the resin material receiving frame 1 and the release film 306 are integrated may function as a resin material feeding mechanism 1A.

Next, the resin material feeding mechanism 1A, which includes the resin material receiving frame 1, the release film 306, and the resin material 10, may be held by the resin material conveying mechanism 7. The resin material conveying mechanism 7 may hold the resin material receiving frame 1 sandwiched therebetween. The first holding portion 7a and the second holding portion 7b of the resin material conveying mechanism 7 may be provided in the transverse direction at different heights, and hold the peripheral edge portion 3 of the release film 306 vertically sandwiched between the first holding portion 7a and the second holding portion 7b.

Next, the resin material feeding mechanism 1A may be lifted from the support table 8 by the resin material conveying mechanism 7. The elevating member 6 may fall along the inner side surface of the peripheral edge portion 3 by its own weight when the resin material feeding mechanism 1A is lifted. The elevating member 6 may fall to a position where the lower surface of the horizontal portion 6a contacts the upper surface of the protruding portion 5 and stop. In this state, the release film 306 and the resin material 10 received on the release film 306 may be pushed downward by the determined distance d by the weight of the elevating member 6. The resin material 10 may be conveyed while being received in a region surrounded by the elevating member 6 (e.g., the resin material receiving portion 2A) on the release film 306.

As described above, the resin material 10 may be blocked from moving from the resin material receiving portion 2A toward the outside by the elevating member 6. In other words, the resin material 10 may be mitigated or prevented from entering between the lower surface of the peripheral edge portion 3 and the upper surface of the release film 306 in a state in which the lower surface of the elevating member 6 closely contacts the release film 306. Thus, the resin material 10 received in the resin material receiving portion 2A may be stably conveyed (transported) by the resin material conveying mechanism 7 without attaching the resin material 10 to the lower surface of the peripheral edge portion 3.

Figure 4A:
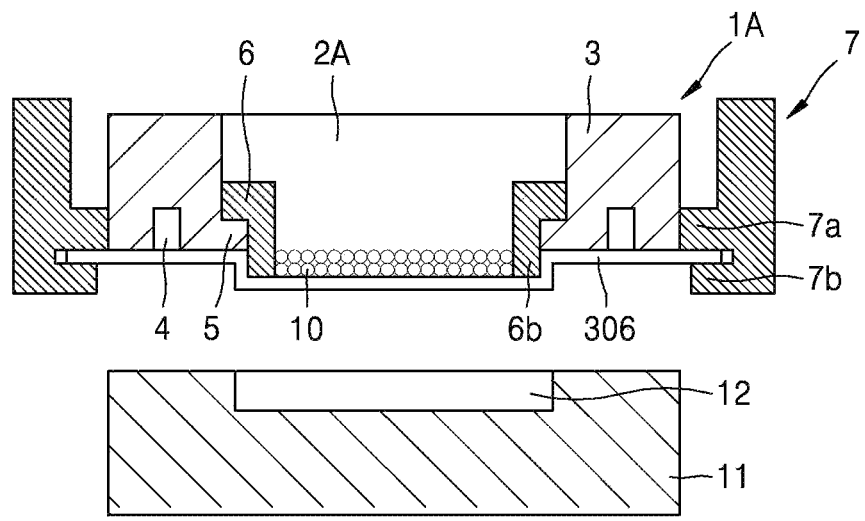
FIGS. 4A to 4C are schematic cross-sectional views for explaining a process of feeding a resin material to a cavity of a lower mold of the resin molding apparatus shown in FIG. 2.
Figure 4B:
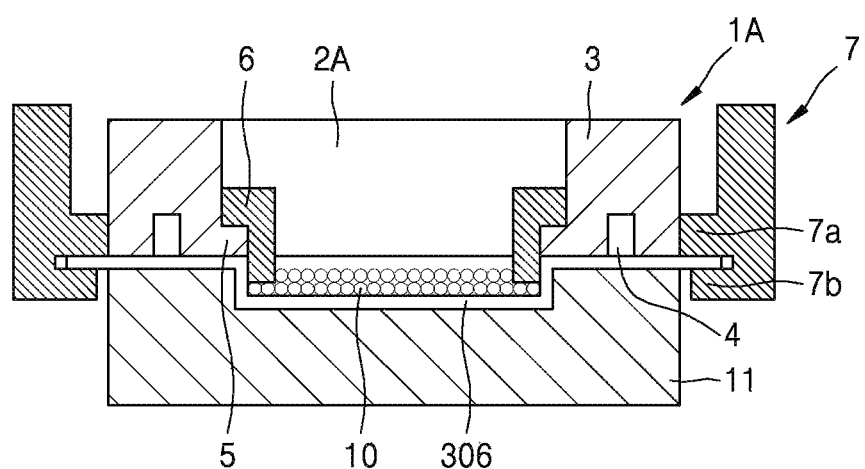
Figure 4C:
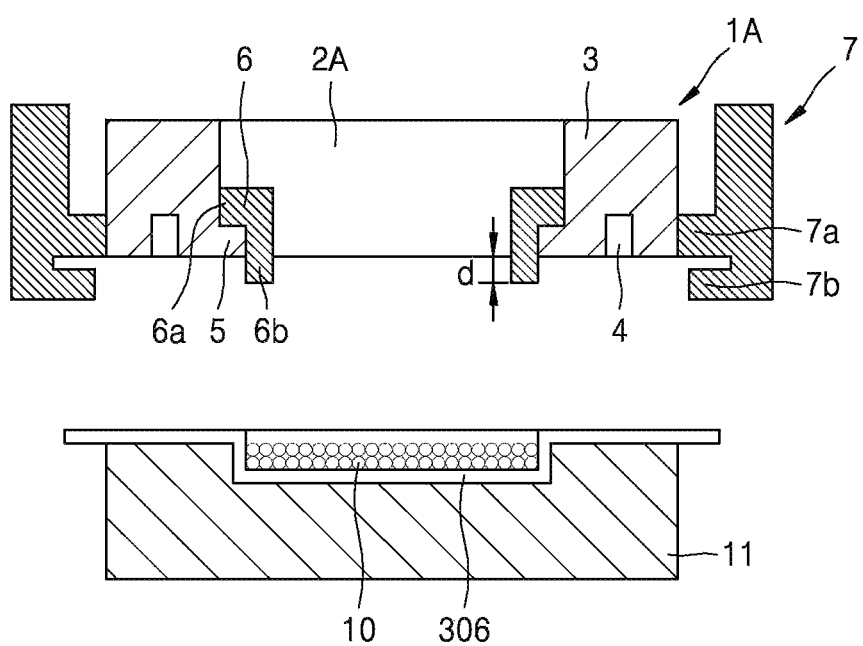

FIGS. 4A to 4C are schematic cross-sectional views for explaining a process of feeding the resin material 10 to the cavity 12 of the lower mold 11 of the resin molding apparatus 300 shown in FIG. 2.

Referring to FIG. 4A, the resin material feeding mechanism 1A may be moved to an upper portion of the lower mold 11 by using the resin material conveying mechanism 7 and stopped. In this state, the release film 306 and the resin material 10 may be pushed downward by the determined distance d by a weight of the elevating member 6. The lower mold 11 may be provided with the cavity 12 through which the resin material 10 and the release film 306 are fed. The cavity 12 may be formed slightly larger than a bottom surface of the resin material receiving portion 2A when seen in a plan view. In other words, the cavity 12 may be formed such that the vertical portion 6b of the elevating member 6 is inserted into the cavity 12. The resin material receiving frame 1 may be formed such that the vertical portion 6b of the elevating member 6 is inserted into the cavity 12.

Referring to FIG. 4B, the resin material feeding mechanism 1A may be lowered by the resin material conveying mechanism 7. The release film 306 and the resin material 10 may be collectively fed into the cavity 12 by lowering the resin material feeding mechanism 1A. A lower surface of the resin material feeding mechanism 1A (e.g., a lower surface of the release film 306) may come into contact with a cavity surface of the lower mold 11. Thus, the release film 306, the resin material 10, and the elevating member 6 may be inserted into the cavity 12. The lower mold 11 may include a first top surface and a second top surface surrounding the first top surface. The first top surface of the lower mold 11 may be lower than the second top surface of the lower mold 11 by the distance d. In this state, the resin material 10 may be inserted to the cavity 12 on the second top surface of the lower mold 11. The resin material 10 and the release film 306 may be collectively inserted into the cavity 12 by the resin material conveying mechanism 7, and thus the resin material 10 may be mitigated or prevented from being scattered from the resin material receiving portion 2A to the outside. Therefore, a desired (or alternatively, predetermined) amount of the resin material 10 may be fed to the cavity 12 stably.

Next, the release film 306 may be released from the adsorption groove 4 of the peripheral edge portion 3. The release film 306 inserted in the cavity 12 may receive heat from a heater (not shown) built in the lower mold 11. The release film 306 may be softened and elongated by receiving heat. The release film 306 may be adsorbed to adsorption holes (not shown) provided in the cavity 12 and the lower mold 11 while the release film 306 is softened. Accordingly, the release film 306 may be adsorbed to correspond to a shape of the cavity 12 without wrinkling or slackening. Further, the resin material 10 and the release film 306 may be collectively fed to the cavity 12.

Referring to FIG. 4C, after the resin material 10 and the release film 9 are collectively fed to the cavity 12, the resin material receiving frame 1 may be raised from the lower mold 11 by the resin material conveying mechanism 7. Only the resin material receiving frame 1 may be held by the resin material conveying mechanism 7 because the resin material 10 and the release film 306 have been fed to the cavity 12. In this state, a lower surface of the vertical portion 6b of the elevating member 6 may be lowered by the distance d from a lower surface of the peripheral edge portion 3. As described above, the resin material 10 and the release film 306 may be stably fed to the cavity 12 from the resin material feeding mechanism 1A.

Figure 5A:
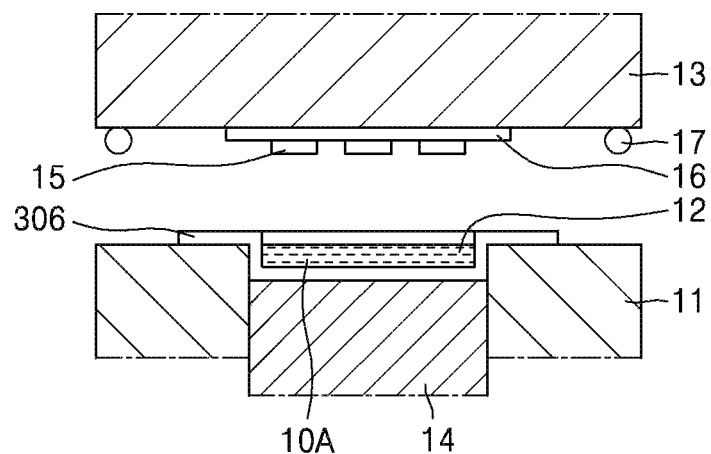
FIGS. 5A and 5B are schematic cross-sectional views illustrating a process of sealing a semiconductor chip mounted on a substrate of the resin molding apparatus shown in FIG. 2 with a resin.
Figure 5B:
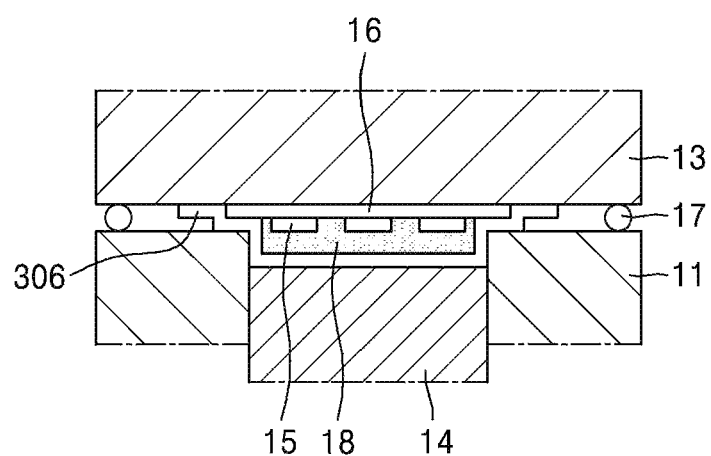

FIGS. 5A and 5B are schematic cross-sectional views illustrating a process of sealing a semiconductor chip mounted on the substrate 16 of the resin molding apparatus 300 shown in FIG. 2 with a resin 10A.

Referring to FIG. 5A, the resin molding apparatus 300 may include the upper mold 13 positioned vertically opposite to the lower mold 11. The upper mold 13 and the lower mold 11 may constitute a molding frame. The lower mold 11 may be provided with a cavity bottom surface member 14 for pressing the resin 10A heated and melted in the cavity 12. The substrate 16 on which the chip type element 15 is mounted may be fixed to the upper mold 13 by adsorption or clamping. A sealing member 17 for blocking the cavity 12 from the outside air may be provided between a surface of the upper mold 13 and a surface of the lower mold 11.

The substrate 16 on which a semiconductor element (e.g., semiconductor device or semiconductor chip) 15 is mounted may be conveyed and fixed to a desired (or alternatively, predetermined) position of the upper mold 13 by a substrate feeding mechanism (not shown) in a state in which the molding frame is opened. As described above, the resin material feeding mechanism 1A may be conveyed to the desired (or alternatively, predetermined) position of the lower mold 11 by the resin material conveying mechanism 7, and the resin material 10 and the release film 306 may be collectively fed to the cavity 12 provided in the lower mold 11. The resin material 10 fed to the lower mold 11 may be heated to generate the molten resin 10A.

Referring to FIG. 5B, the upper mold 13 and the lower mold 11 may be coupled by a coupling mechanism (not shown). The semiconductor element 15 mounted on the substrate 16 may be immersed in the molten resin 10A in the cavity 12. The cavity bottom surface member 14 may be moved upward by a driving mechanism (not shown) to press the molten resin 10A.

Subsequently, a cured resin layer 18 may be formed by heating the molten resin 10A. In this state, the semiconductor element 15 mounted on the substrate 16 may be sealed by the resin layer 18. After the resin sealing is completed, the upper mold 13 and the lower mold 11 may be opened (e.g., separated from each other). After the upper metal mold 13 and the lower metal mold 11 are opened, the semiconductor element 15 formed using the release film 306 may be separated.

Figure 6A:
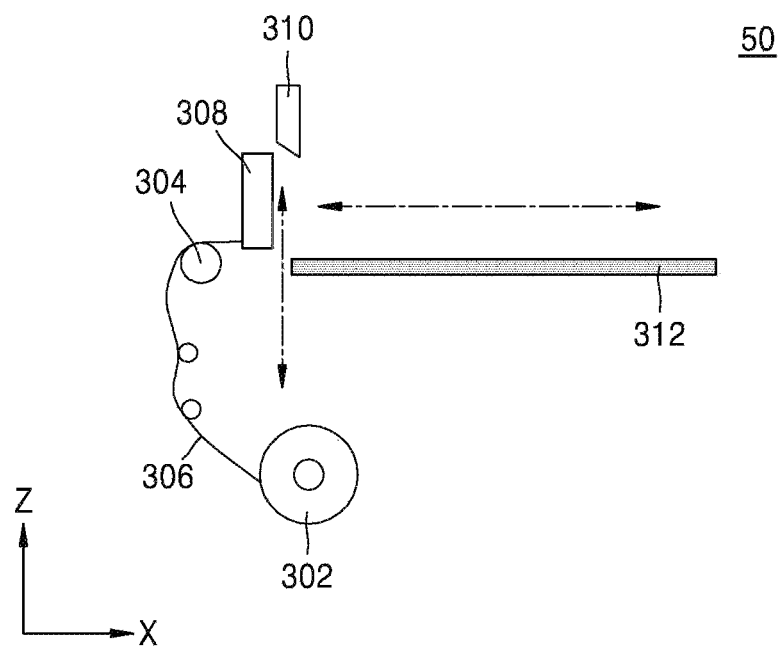
FIGS. 6A and 6B are a side view and a plan view, respectively, for explaining a schematic configuration of a release film feeding apparatus shown in FIG. 1.
Figure 6B:
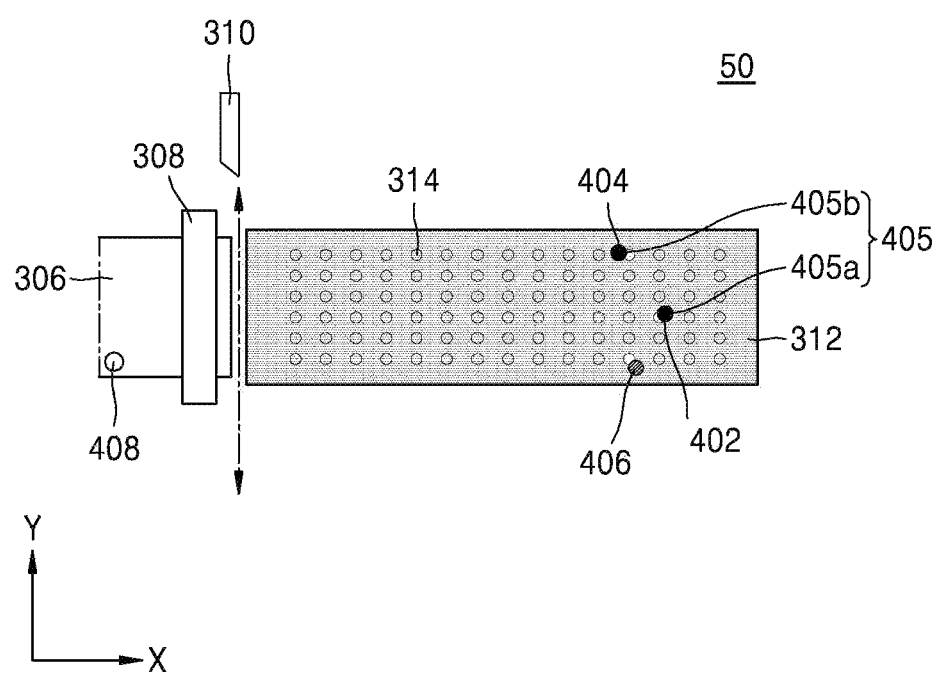

FIGS. 6A and 6B are a side view and a plan view, respectively, for explaining a schematic configuration of the release film feeder 50 shown in FIG. 1.

The release film feeder 50 may include the feeding roller 302 on which the release film 306 is wound and the guide roller 304 for guiding the release film 306 fed from the feeding roller 302.

The release film feeder 50 may include the gripper 308 for gripping an end portion of the release film 306. The gripper 308 may move the release film 306 in a horizontal direction, that is, an X direction, and position the release film 306 on the support table 312 by the gripper driver (309 in FIG. 1).

The release film feeder 50 may include the support table 312 for supporting the release film 306 moved in the horizontal direction by the gripper 308. The support table 312 may move horizontally in at least one of X and Y directions. The support table 312 may also move vertically in a Z direction, as desired.

The support table 312 may include vacuum holes 314 capable of adsorbing the release film 306. Position detecting sensors 402, 404, and 405 capable of detecting a position of the release film 306 may be installed on the support table 312. The position detecting sensors 402, 404, and 405 may be classified into a first position detecting sensor 402, a second position detecting sensor 404 and a third position detecting sensor 405. The third position detecting sensor 405 may be comprised of a first sub-sensor 405a and a second sub-sensor 405b. A position of the first sub-sensor 405a and a position of the second sub-sensor 405b may correspond to a position of a first position detecting sensor 402 and a position of the second position detecting sensor 404, respectively.

The first position detecting sensor 402 may be a sensor for detecting the position of the release film 306 in the X direction on the support table 312. The second position detecting sensor 404 may be a sensor for detecting the position of the release film 306 in the Y direction on the support table 312.

The third position detecting sensor 405, which includes the first sub-sensor 405a and the second sub-sensor 405b may detect the position of the release film 306 in a rotational direction from the X direction to the Y direction, (e.g., tilting of the release film 306 from the X direction to the Y direction.

For example, the third position detecting sensor 405 may detect the position of the release film 306 in the tilt direction from the X direction to the Y direction by measuring a detection time difference of the release film 306 when the release film 306 moves in the horizontal direction by the gripper 308.

When the release film 306 is a multilayer release film 306-1 in which auxiliary film layers 306b are stacked on a release function layer 306a as described later, the first position detecting sensor 402, the second position detecting sensor 404, and the third position detecting sensor 405 also may detect positions of the auxiliary film layers 306b in the X direction, the Y direction, and the rotational direction from the X direction to the Y direction.

The release film feeder 50 may include the position detecting sensors 402, 404, and 405 to seat the release film 306 at an accurate position on the support table 312. Further, the release film feeder 50 may provide a reject mark 408 on a part of the release film 306 that is defective during a manufacturing or conveying process. When there is the reject mark 408 as described above, a reject mark detecting sensor 406 capable of detecting the reject mark 408 of the release film 306 may be installed on the support table 312.

The position detecting sensors 402, 404, and 405 and the reject mark detecting sensor 406 may use an optical sensor or a weight sensor. The position detecting sensors 402, 404, and 405 and the reject mark detecting sensor 406 may be vision cameras including image sensors. In FIG. 6B, the position detecting sensors 402, 404, 405a, and 405b and the reject mark detecting sensor 406 are installed on the support table 312. However, the position detecting sensors 402, 404, and 405 and the reject mark detecting sensor 406 may be installed in an upper portion of the support table 312 according to types of sensors.

The release film feeder 50 may include the cutting unit (380 in FIG. 1) for cutting the release film 306 after the release film 306 is seated on the support table 312. The cutting unit 380 may cut the release film 306 by the blade driver (384 in FIG. 1). Accordingly, the release film feeder 50 may cut a portion of the release film 306 including the reject mark 408 by the blade 310 of the cutting unit (380 in FIG. 1) and reject the portion of the release film 306 including the reject mark 408.

Figure 7A:
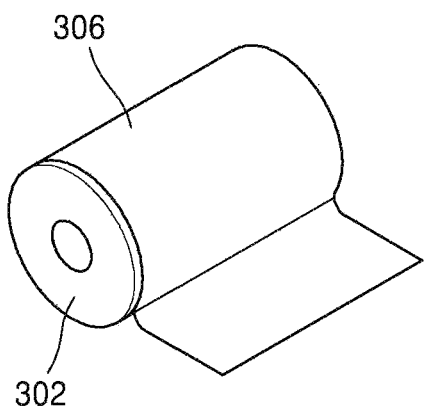
FIG. 7A is a perspective view showing an example embodiment of a release film wound on a feeding roller of the release film feeding apparatus shown in FIG. 1.
Figure 7B:
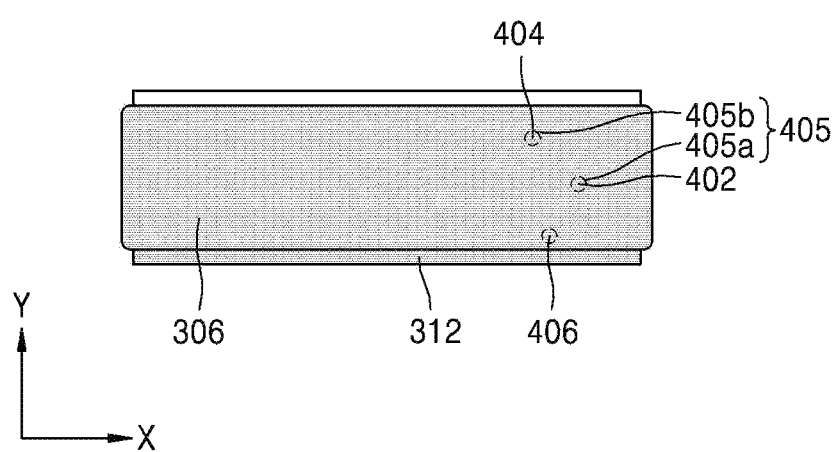
FIG. 7B is a plan view showing the release film of FIG. 7A positioned on a support table.

FIG. 7A is a perspective view showing an example embodiment of the release film 306 wound on the feeding roller 302 of the release film feeder 50 shown in FIG. 1. FIG. 7B is a plan view showing the release film 306 of FIG. 7A positioned on the support table 312.

For example, the release film feeder (50 of FIG. 1) may be provided with the feeding roller 302 wound with the release film 306 as shown in FIG. 7A. In other words, the release film 306 may be wound around the feeding roller 302. The release film 306 may be used to separate a completely molded chip-type element from the lower mold (11 in FIG. 5B) as described above. The release film 306 of FIG. 7A may be a single layer of a release function layer. The release function layer constituting the release film 306 may include, for example, a silicone-based releasing agent, an epoxy-based releasing agent, or a fluorine-based releasing agent.

The release film feeder (50 in FIG. 1) may move and seat the release film 306 on the support table 312 using the gripper (308 in FIG. 1) and cut the release film 306 into a desired or proper size. As shown in FIG. 7B, the release film feeder (50 in FIG. 1) may accurately seat the release film 306 on a wanted position of the support table 312 by using, for example, the position detecting sensors 402, 404, and 405.

Further, as shown in FIG. 7B, the release film feeder (50 in FIG. 1) may not include the reject mark 408 in the release film 306 by using the reject mark detecting sensor 406. Accordingly, the release film 306 in which defects are suppressed or reduced may be fed on the support table 312.

Figure 8A:
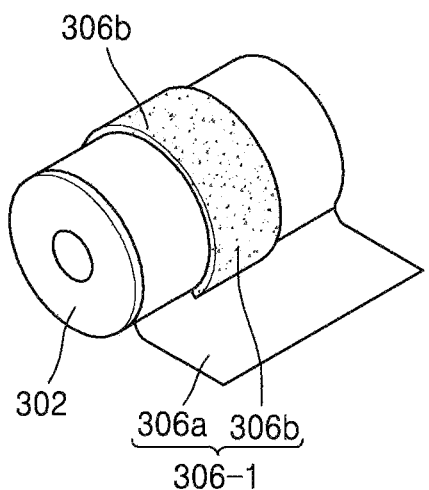
FIG. 8A is a perspective view showing an example embodiment of a release film wound on a feeding roller of the release film feeding apparatus shown in FIG. 1.
Figure 8B:
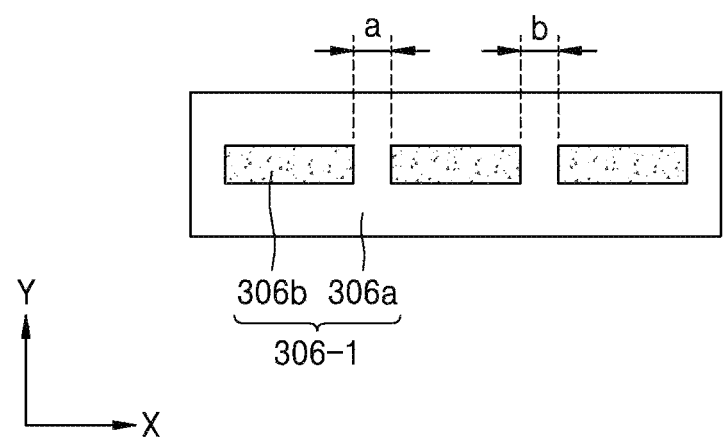
FIG. 8B is a plan view of the release film of FIG. 8A
Figure 8C:
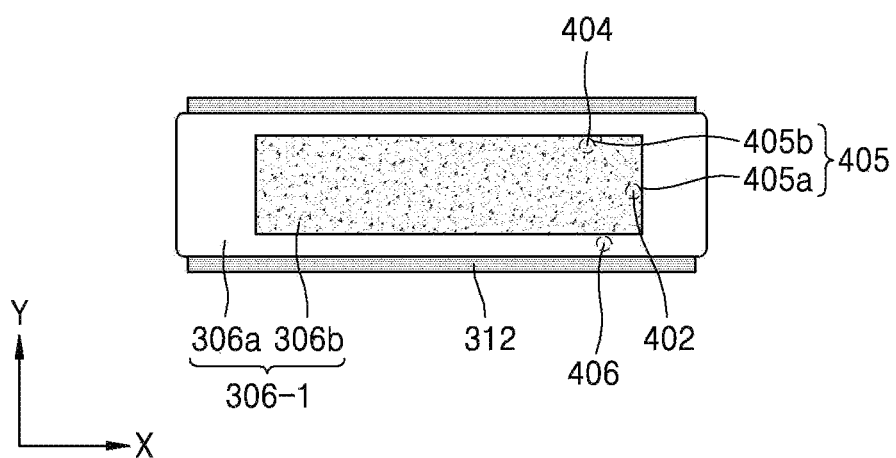
FIG. 8C is a plan view showing the release film of FIG. 8A positioned on a support table.

FIG. 8A is a perspective view showing an example embodiment of a release film 306-1 wound on the feeding roller 302 of the release film feeder 50 shown in FIG. 1. FIG. 8B is a plan view of the release film 306-1 of FIG. 8A. FIG. 8C is a plan view showing the release film 306-1 of FIG. 8A positioned on the support table 312.

For example, the release film feeder (50 of FIG. 1) may be provided with the feeding roller 302 wound with the release film 306-1 as shown in FIG. 8A. In other words, the release film 306-1 may be wound around the feeding roller 302. The release film 306-1 may be used to separate a completely molded semiconductor element from the lower mold (11 in FIG. 5B) as described above.

The release film 306-1 may include a multilayer structure having the release function layer 306a that performs a release function for separating the molded chip-type element from the lower mold, and the auxiliary film layers 306b for realizing additional functions of the molded chip-type element, for example, improvement of electromagnetic interference (EMI), improvement of heat radiation property, or implementation of a marking film. The auxiliary film layers 306b constituting the release film 306-1 may include a thermochromic material and/or a photochromic material which reacts with electromagnetic waves.

The release film 306-1 may have a multilayer structure including the release function layer 306a and the plurality of auxiliary film layers 306b that are spaced apart from each other on the release function layer 306a, as shown in FIG. 8B. Distances a and b between the auxiliary film layers 306b may not be the same in a manufacturing process.

The release film feeder (50 in FIG. 1) may move and seat the release film 306-1 on the support table 312 using the gripper (308 in FIG. 1) and cut the release film 306-1 into a proper size. As shown in FIG. 8C, the release film feeder (50 in FIG. 1) may include the position detecting sensors 402, 404, and 405.

The position detecting sensors 402 and 404 may be distinguished from the first position detecting sensor 402, the second position detecting sensor 404 and the third position detecting sensor 405. The first position detecting sensor 402 and the first sub-sensor 405a may be provided corresponding to one end of the auxiliary film layer 306b in the X direction. The second position detecting sensor 404 and the second sub-sensor 405b may be provided corresponding to one end of the auxiliary film layer 306b in the Y direction. The first position detecting sensor 402, the second position detecting sensor 404 and the third position detecting sensor 405 may detect positions of the auxiliary film layers 306b in the X direction, the Y direction, and a rotational direction from the X direction to the Y direction.

The release film feeder (50 in FIG. 1) may seat the release film 306-1 including the auxiliary film layers 306b on a wanted position of the support table 312 with an improved accuracy by using the position detecting sensors 402, 404, and 405.

As described above, in the case where the release film 306-1 includes the auxiliary film layers 306b that are spaced apart from each other with different intervals, the position detecting sensors 402, 404, and 405 may be used to accurately seat the release films 306-1 on the wanted position of the support table 312. This will be described in more detail later.

Further, as shown in FIG. 8C, the release film feeder (50 in FIG. 1) may include the reject mark detecting sensor 406 for detecting a reject mark on the support table 312. The reject mark detecting sensor 406 may be provided to correspond to the release function layer 306a outside the auxiliary film layers 306b.

Accordingly, the release film feeder (50 of FIG. 1) may use the reject mark detecting sensor 406 not to feed the release film 306-1 with the reject mark 408.

FIGS. 9A to 9G are plan views for explaining feeding of the release film 306-1 onto the support table 312 by using the release film feeder 50 shown in FIG. 1.

For example, it will be described with reference to FIGS. 9A to 9G that the release film 306-1 of a multilayer structure shown in FIGS. 8A to 8C is fed onto the support table 312 by using the release film feeder 50 of FIGS. 1, 6A and 6B.

Figure 9A:
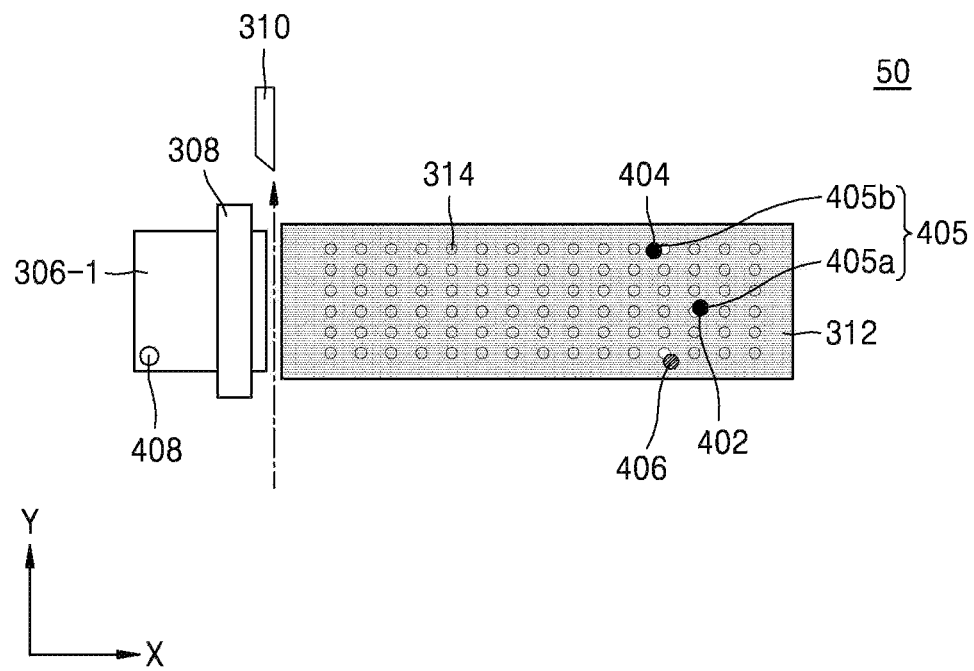
FIGS. 9A to 9G are plan views for explaining feeding of a release film onto a support table by using the release film feeding apparatus shown in FIG. 1.

Referring to FIG. 9A, a preparation operation for feeding the release film 306-1 onto the support table 312 may be shown. The release film feeder 50 may include the gripper 308 capable of gripping an end portion of the release film 306-1 and moving the release film 306-1 on the support table 312 in a horizontal direction (X direction) and the blade 310 capable of cutting the release film 306-1.

The first position detecting sensor 402, the second position detecting sensor 404 and the third position detecting sensor 405 capable of detecting a position of the release film 306-1 may be installed on the support table 312. The release film 306-1 may be provided with the reject mark 408 due to a defect during manufacturing or transportation.

Figure 9B:
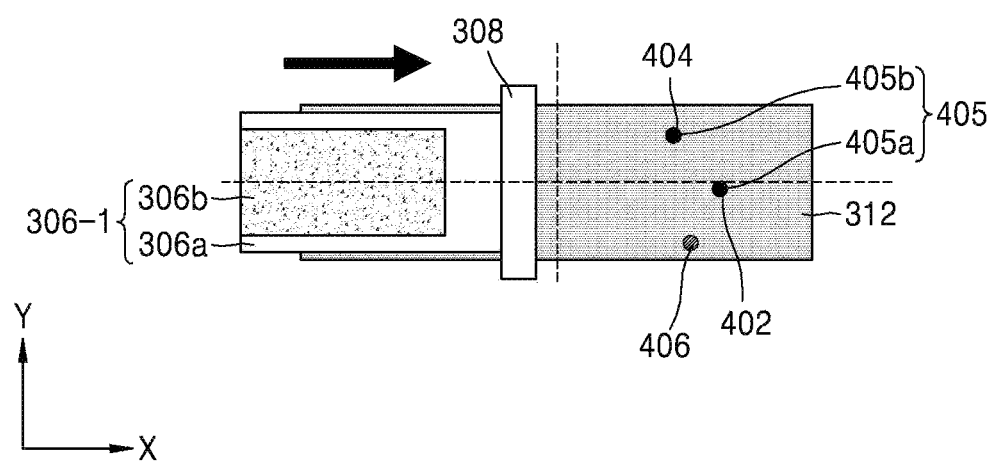

Referring to FIG. 9B, a start operation of feeding of the release film 306-1 onto the support table 312 is shown. The gripper 308 may be used to move the release film 306-1 in the horizontal direction, that is, in the X direction, to cover a part of the support table 312.

Figure 9C:
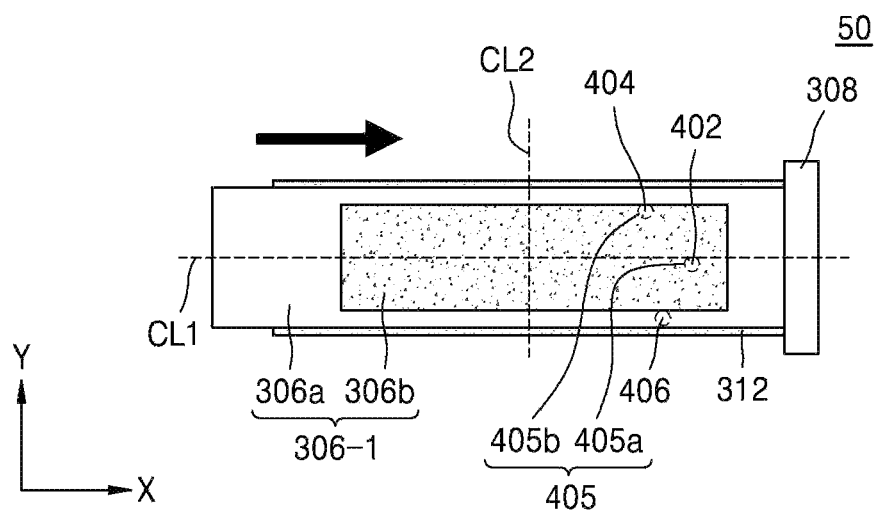

Referring to FIG. 9C, a completion operation of feeding of the release film 306-1 onto the support table 312 is shown. The gripper 308 may be used to sufficiently move the release film 306-1 in the horizontal direction, that is, in the X direction, to cover the entirety of the support table 312.

When the release film 306-1 is moved in the horizontal direction, that is, in the X direction, by using the gripper 308, the first position detecting sensor 402, the second position detecting sensor 404, the third position detecting sensor 405 may measure an initial position of the release film 306-1 in the X direction, the Y direction, and a rotational direction from the X direction to the Y direction.

Figure 9D:
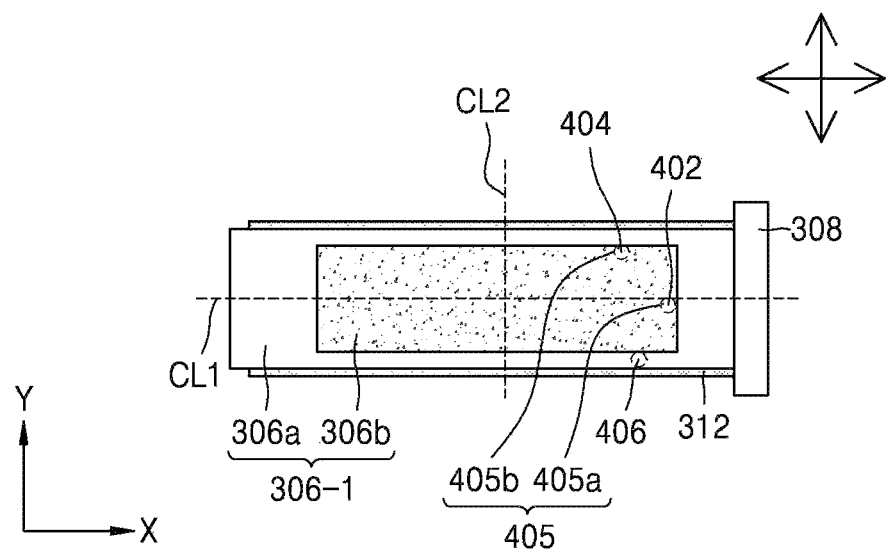

Referring to FIG. 9D, a position adjustment operation of adjusting the position of the release film 306-1 on the support table 312 is shown.

The gripper 308 may be moved in the horizontal direction, that is, in the X direction and a –X direction by using the first position detecting sensor 402, so that an X-axis center line CL1 of the release film 306-1 is accurately mounted on the X-axis center line CL1 of the support table 312.

In an embodiment, the gripper 308 may be moved in the horizontal direction, that is, in the X direction and the –X direction by using the first position detecting sensor 402 so that the X-axis center line CL1 of the release film 306-1 is accurately mounted on the X-axis center line CL1 of the auxiliary film layer 306b and the support table 312.

When the first position detecting sensor 402 is positioned on a lower surface of one end of the auxiliary film layer 306b in the X direction, the first position detecting sensor 402 may detect a degree by which the auxiliary film layer 306b deviates from the support table 312 in the X direction, and accurately mount the X-axis center line CL1 of the release film 306-1 on the X-axis center line CL1 of the auxiliary film layer 306b and the X-axis center line CL1 of the support table 312.

Further, the second position detecting sensor 404 may be used to move the support table 312 in the Y direction and a –Y direction so that a Y-axis center line CL2 of the release film 306-1 is accurately mounted on the Y-axis center line CL2 of the support table 312.

When the second position detecting sensor 404 is positioned on the lower surface of one end of the auxiliary film layer 306b in the Y direction, the second position detecting sensor 404 may detect a degree by which the auxiliary film layer 306b deviates from the support table 312 in the Y direction, and may accurately mount the Y-axis center line CL2 of the release film 306-1 included in the release film 306-1 on the Y-axis center line CL2 of the support table 312.

Also, the accuracy of the initial position of the release film 306-1 positioned on the support table 312 in the rotational direction from the X direction to the Y direction may be determined by using the third position detecting sensor 405 in FIG. 9C above. The position of the release film 306-1 in the rotational direction from the X direction to the Y direction may be measured by using the third position detecting sensor 405.

Further, when the third position detecting sensor 405 is positioned on the lower surface of one end of the auxiliary film layer 306b in the X direction and the Y direction, the accuracy of a position of the auxiliary film layer 306b included in the release film 306-1 in the rotational direction from the X direction to the Y direction may be measured.

Figure 9E:
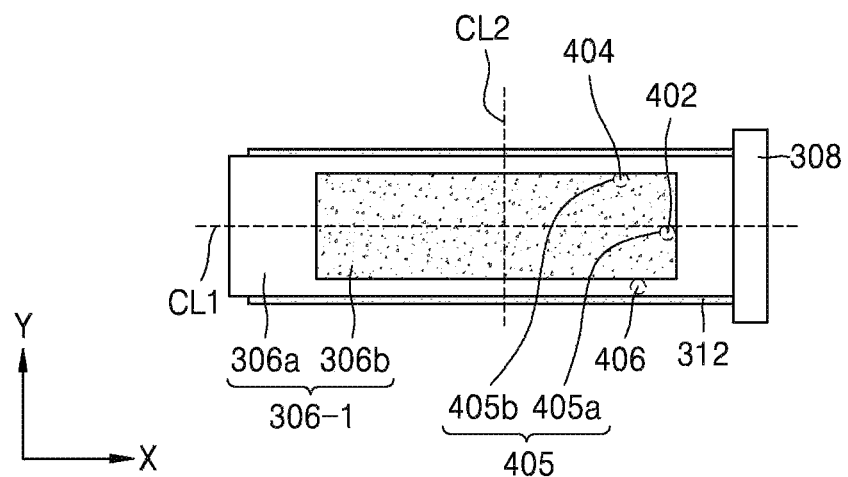

Referring to FIG. 9E, a release film adsorption operation of adsorbing the release film 306-1 on the support table 312 is shown. The release film 306-1 may be adsorbed on the support table 312 by pumping the release film 306-1 by a vacuum pump (not shown) using the vacuum holes (314 in FIG. 6B) formed in the support table 312.

Figure 9F:
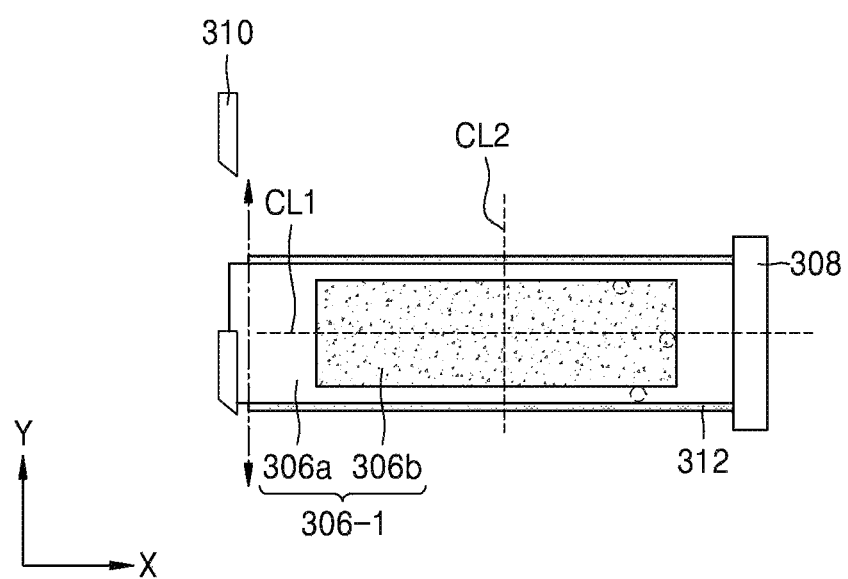

Referring to FIG. 9F, a release film cutting operation of cutting the release film 306-1 on the support table 312 is shown. After the release film 306-1 is adsorbed, the release film 306-1 may be cut by the blade 310 of the cutting unit (380 in FIG. 1).

When the position of the release film 306-1 in the rotational direction from the X direction to the Y direction is not correct according to information detected by the third position detecting sensor 405 in operations of 9C to 9E, the cut release film 306-1 may be rejected.

In operations 9A to 9E, when the reject mark (408 in FIG. 9A) is detected using the reject mark detecting sensor 406 in the release film 306-1, the cut release film 306-1 may be rejected.

Figure 9G:
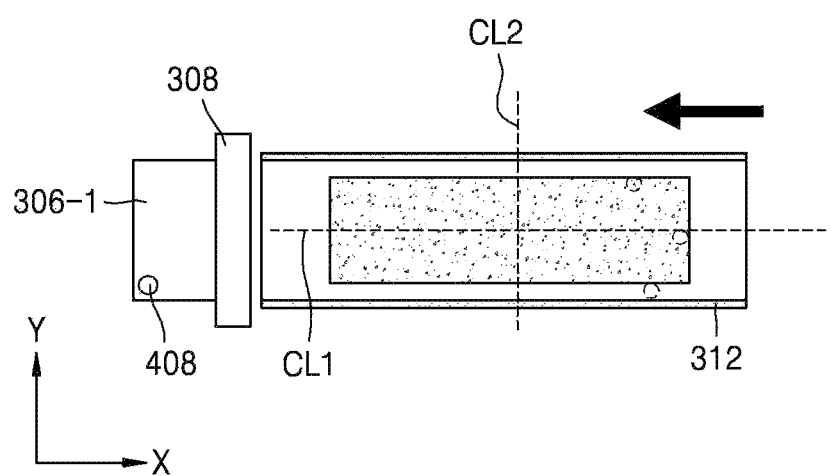

Referring to FIG. 9G, a returning operation of returning the gripper 308 to one side of the support table 312 is shown. After the gripper 308 releases gripping of the release film 306-1, the gripper 308 may be moved to one side of the support table 312 to grip the release film 306-1 again. When the gripper 308 grips the release film 306-1, the preparation operation for feeding the release film 306-1 may start repeated.

Figure 10A:
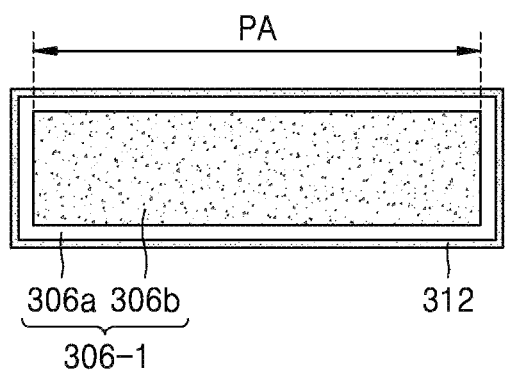
FIGS. 10A and 10B are plan views showing a release film fed on a support table according to an example embodiment of the inventive concepts and a comparative example, respectively.
Figure 10B:
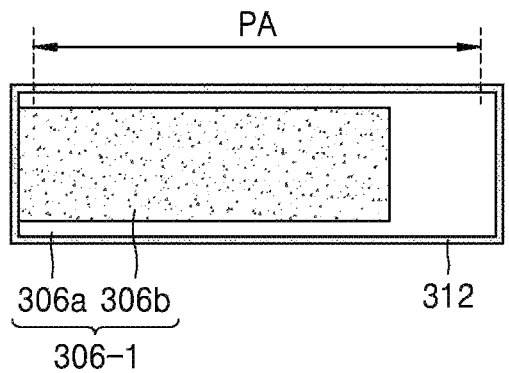
Figure 11A:
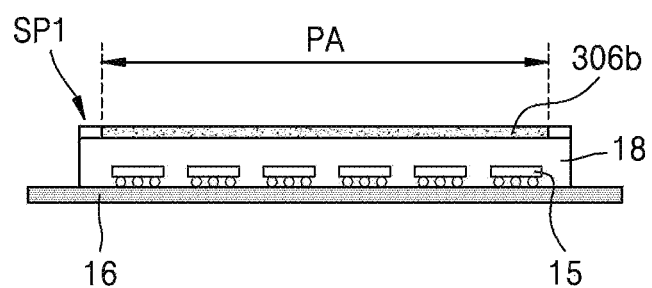
FIGS. 11A and 11B are cross-sectional views showing chip type elements molded by a resin molding apparatus according to some example embodiments of the inventive concepts and a comparative example, respectively.
Figure 11B:
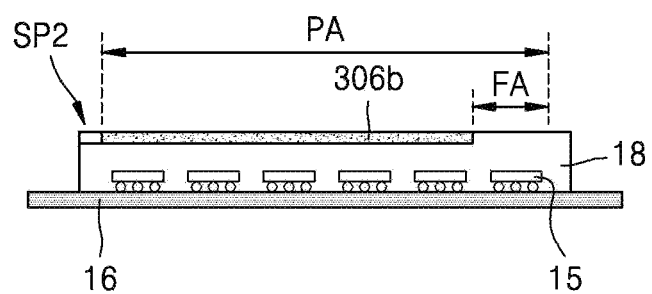

FIGS. 10A and 10B are plan views showing the release film 306-1 fed on the support table 312 according to an example embodiment of the inventive concepts and a comparative example, respectively. FIGS. 11A and 11B are cross-sectional views showing chip type elements SP1 and SP2 molded by a resin molding apparatus according to some example embodiments of the inventive concepts and a comparative example, respectively.

Referring to FIG. 10A, when the release film feeder (50 of FIGS. 1, 6A and 6B) is used, the release film 306-1 may be accurately fed to a package forming area PA on the support table 312. The release film 306-1 may include the release functional layer 306a and the auxiliary film layer 306b. In the comparative example of FIG. 10B, the release film 306-1 may be fed only to a part of the package forming area PA on the support table 312.

According to an example embodiment shown in FIGS. 10A and 11A, when a plurality of molded chip type elements SP1 are formed after accurately feeding the release film 306-1 onto the support table 312, the auxiliary film layer 306b may be accurately provided on the resin layer 18 of the molded chip type elements SP1, that is, the package forming area PA.

In the comparative example of FIGS. 10B and 11B, the release film 306-1 may be fed only to a portion of the package forming area PA on the support table 312, and thus the auxiliary film layer 306b may be formed only a portion on the resin layer 18 of a plurality of molded chip type elements SP2 (e.g., a portion of the package forming area PA), and a defective area FA in which no auxiliary film layer is formed may be formed on the resin layer 18.

Figure 12:
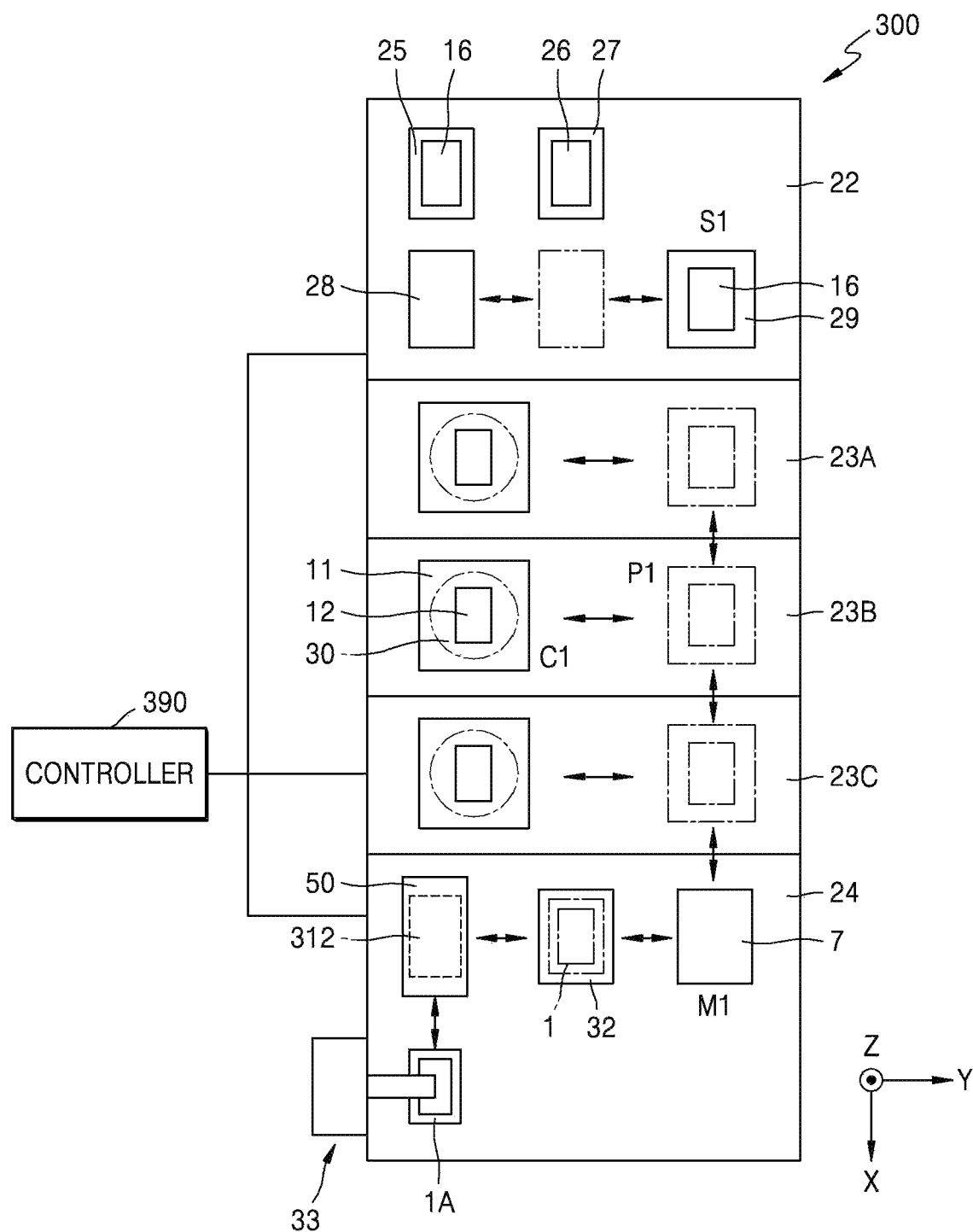
FIG. 12 is a schematic block diagram of a resin molding apparatus including a release film feeding apparatus according to an example embodiment the inventive concepts.

FIG. 12 is a schematic block diagram of the resin molding apparatus 300 including the release film feeder 50 according to an example embodiment of the inventive concepts.

For example, the resin molding apparatus 300 may include a substrate feeding/storage module 22 for feeding the substrate 16 before molding and storing a molding completion substrate 26, a resin material feeding module 24 capable of feeding a resin onto a chip type element on the substrate 16 before molding, molding modules 23A, 23B and 23C, each of which includes the upper mold 13 and the lower mold 11 for feeding the resin therebetween to form the semiconductor element on the substrate 16, and a controller 390 for controlling the substrate feeding/storage module 22, the molding modules 23A, 23B and 23C, and the resin material feeding module 24.

The substrate feeding/storage module 22, the molding modules 23A, 23B and 23C, and the resin material feeding module 24 may be detached from each other and exchanged with each other with respect to different components. For example, when the substrate feeding/storage module 22 and the molding module 23A are mounted, the molding module 23B may be mounted on the molding module 23A, and the resin material feeding module 24 may be mounted on the molding module 23B.

The substrate feeding/storage module 22 may be provided with a substrate feeding portion 25 before molding for feeding the substrate 16 before molding, a molding completion substrate storing portion 27 for storing the molding completion substrate 26, a substrate placement portion 28 for delivering the substrate 16 before molding and the molding completion substrate 26, and a substrate conveying mechanism 29 for conveying the substrate 16 before molding and the molding completion substrate 26.

The substrate placement portion 28 may move in the substrate feeding/storage module 22 in a Y direction. The substrate conveying mechanism 29 may move in the substrate feeding/storage module 22 and each of the molding modules 23A, 23B and 23C in an X direction and a Y direction. A determined position S1 may be a position where the substrate conveying mechanism 29 waits without operating.

Each of the molding modules 23A, 23B and 23C may be provided with the lower mold 11 capable of elevating and the upper mold 13 disposed opposite to the lower mold 11. The upper mold 13 and the lower mold 11 may constitute a molding frame. Each of the molding modules 23A, 23B and 23C may have a coupling mechanism 30 (a circular part indicated by a two-dot chain line) for coupling and non-coupling the upper mold 13 and the lower mold 11. The cavity 12 to which the release film (306 in FIG. 1) and the resin material 10 are fed may be provided in the lower mold 11. The lower mold 11 and the upper mold 13 may move relative to each other to be coupled and non-coupled.

The resin material feeding module 24 may be provided with the release film feeder 50 for feeding the release film 306 by using the gripper (308 in FIG. 1) on the support table 312 capable of horizontally moving in the X and Y directions, the resin material receiving frame 1 to which the release film (306 in FIG. 7A, 306-1 in FIG. 8A) is attached to receive the resin material 10, a cleaning mechanism 32 for cleaning a lower surface or an inner side surface of the resin material receiving frame 1 capable of receiving the resin material 10, the resin material conveying mechanism 7 for conveying the resin material receiving frame 1 to which the release film is attached, that is, the resin material feeding mechanism 1A, and a resin material injection mechanism 33 for injecting the resin material 10 into the resin material receiving portion (2A in FIG. 3B).

The support table 312 may horizontally move within the resin material feeding module 24 in the X direction and the Y direction. The position detecting sensors (402, 404, and 405 in FIG. 6B) for detecting a position of the release film (306 in FIG. 7A, 306-1 in FIG. 8A) may be provided on the support table 312. The controller 390 may control the position detecting sensors 402, 404, and 405 to control a movement position of the release film in the X direction, the Y direction, and a rotational direction from the X direction to the Y direction.

Further, the controller 390 may continuously control the release film feeder 50 by reflecting an accumulated error of the movement position of the release film detected by the position detecting sensors 402 and 404. In other words, when the gripper (308 in FIG. 1) is used to continuously feed the release film 306 onto the support table 312, the controller 390 may adjust the accumulated error of the movement position of the release film.

The reject mark detecting sensor (406 in FIG. 6B) for detecting a position of the reject mark (408 in FIG. 6A) provided in the release film (306 in FIG. 7A, 306-1 in FIG. 8A) on the support table 312. In an embodiment, when the release film (306-1 in FIG. 8A) includes the auxiliary film layer 306b described above, the controller 390 may selectively use or reject the release film (306-1 in FIG. 8A) according to a sensing result of the reject mark detecting sensor 406. In other words, when the release film (306-1 in FIG. 8A) is provided with the reject mark (408 in FIG. 6A), the controller 390 may control to cut and reject the reject release film (306-1 in FIG. 8A) and feed only the release film (306-1 in FIG. 8A) without the reject mark (408 in FIG. 6A).

The resin material conveying mechanism 7 may move within the resin material feeding module 24 and each of the molding modules 23A, 23B and 23C in the X direction and the Y direction. A determined position M1 may be a position where the resin material conveying mechanism 7 waits without operating.

Next, an operation of sealing a resin using the resin molding apparatus 300 will be described.

First, the substrate feeding/storage module 22 may send the substrate 16 before sealing from the substrate feeding portion 25 before sealing to the substrate placement portion 28. Then, the substrate conveying mechanism 29 may be moved in a −Y direction from the determined position S1 to receive the substrate 16 before sealing from the substrate placement portion 28. The substrate conveying mechanism 29 may be returned to the determined position S1.

Next, for example, the substrate conveying mechanism 29 may be moved in a +X direction to the determined position P1 of the forming module 23B. Next, the substrate conveying mechanism 29 may be moved in the −Y direction in the forming module 23B to stop at a determined position C1 on the lower mold 11. Then, the substrate conveying mechanism 29 may be moved upward to fix the substrate 16 before sealing to the upper mold (13 in FIG. 5A). The substrate conveying mechanism 29 may be returned to the determined position S1 of the substrate feeding/storage module 22.

Next, the resin material conveying mechanism 7 may be moved in the −Y direction from the determined position M1 to receive the resin material feeding mechanism (1A in FIG. 3D) disposed on the support table 312. The resin material conveying mechanism 7 may be returned to the original position M1. Next, the resin material conveying mechanism 7 may be moved in the −X direction to the determined position P1 of the forming module 23B.

Next, the resin material conveying mechanism 7 may be moved in the −Y direction in the molding module 23B to stop at the determined position C1 on the lower mold 11. Next, the resin material conveying mechanism 7 may be lowered to feed the resin material 10 and the release film 306 to the cavity 12. The resin material conveying mechanism 7 may be returned to the determined position M1.

Next, the lower mold 11 may be moved upward by the coupling mechanism 30 in the molding module 23B, and the upper mold 13 and the lower mold 11 are spotted. After a desired (or alternatively, predetermined) time has elapsed, the upper mold 13 and the lower mold 11 may be non-coupled. Next, the substrate conveying mechanism 29 may be moved from the determined position S1 of the substrate feeding/storage module 22 to the determined position C1 on the lower mold 11 to receive the molding completion substrate (molded substrate) 26.

Next, the substrate conveying mechanism 29 may be moved to an upper surface of the substrate placement portion 28 via the determined position S1, and the molding completion substrate 26 may be delivered to the substrate placement portion 28. The molding completion substrate 26 may be stored in the molding completion substrate storing portion 27 from the substrate placement portion 28. Thus, resin sealing may be completed.

In the present embodiment, at least one molding module, for example, the three molding modules 23A, 23B, and 23C, may be arranged between the substrate feeding/storage module 22 and the resin material feeding module 24 in the X direction. The substrate feeding/storage module 22 and the resin material feeding module 24 may be provided as one module, and then the one molding module 23A may be arranged in the X direction and detachably connected to the one module. Further, the other molding module 23B may be detachably connected to the molding module 23A.

In the present example embodiment, a resin molding apparatus and a resin molding method used for resin sealing a chip type element, for example, a semiconductor integrated circuit element (a semiconductor chip) are described. A resin sealing object may be a semiconductor chip (e.g., a transistor or a chip of a passive element). The inventive concepts may be applied when one or a plurality of chip type elements mounted on a substrate (e.g., a lead frame, a printed board, or a ceramics substrate) is sealed with a cured resin. Further, example embodiments of the inventive concepts are not limited to the case where electronic parts are sealed by resin. For example, the inventive concepts may be applied to the case where optical parts (e.g., a lens, a reflector, a light guide plate, or an optical module) are sealed by resin molding.

While the inventive concepts have been particularly shown and described with reference to some example embodiments thereof, it will be understood that various changes in form and details may be made therein without departing from the spirit and scope of the following claims.

What is claimed is:

1. A resin molding apparatus including a release film feeder configured to feed a release film, the release film feeder comprising:
   a feeding roller configured to wind the release film thereon, the release film having a multilayer structure including a stack of a release function layer and a plurality of auxiliary film layers spaced apart from each other on the release function layer;

a gripper configured to grip an end portion of the release film fed from the feeding roller;

a support table configured to support the release film fed by a horizontal movement of the gripper in an X direction, the support table configured to horizontally move in at least one of the X direction or in a Y direction perpendicular to the X direction, the X and Y directions defining a surface parallel to a surface of the support table; and a position detecting sensor on the support table and configured to detect position information of the release film.

2. The resin molding apparatus of claim 1, wherein the position detecting sensor comprises a first position detecting sensor configured to detect a position of the release film in the X direction.

3. The resin molding apparatus of claim 2, wherein the position detecting sensor comprises a second position detecting sensor configured to detect a position of the release film in the Y direction.

4. The resin molding apparatus of claim 3, wherein the position detecting sensor comprises a third position detecting sensor configured to detect a position of the release film in a rotational direction from the X direction to the Y direction.

5. The resin molding apparatus of claim 1, wherein the release film feeder further comprises a reject mark detecting sensor configured to detect the reject mark on the release film, the reject mark detecting sensor being on the support table.

6. The resin molding apparatus of claim 1, wherein the release film is configured as a single layer comprising a release function layer or as the multilayer structure comprising the stack of the release function layer and the plurality of auxiliary film layers spaced apart from each other at regular intervals on the release function layer.

7. The resin molding apparatus of claim 1, wherein the release film feeder further comprises a consumption amount measuring sensor, the consumption amount measuring sensor being adjacent to the feeding roller and configured to detect a consumption amount of the release film.

8. The resin molding apparatus of claim 1, wherein the release film feeder further comprises a defect detecting sensor, the defect detecting sensor being between the feeding roller and the support table and configured to detect whether the release film is defective.

9. A resin molding apparatus comprising a release film feeder configured to feed a release film, the release film feeder comprising:

a feeding roller around which the release film is wound, the release film having a multilayer structure including a stack of a release function layer and a plurality of auxiliary film layers spaced apart from each other at regular intervals on the release function layer;

a gripper configured to grip an end portion of the release film fed from the feeding roller;

a support table configured to support the release film fed by a horizontal movement of the gripper in an X direction, the support table configured to horizontally move in at least one of the X direction or in a Y direction perpendicular to the X direction, the X and Y directions defining a surface parallel to a surface of the support table; and a position detecting sensor on the support table, the position detecting sensor configured to detect positions of the plurality of auxiliary film layers.

10. The resin molding apparatus of claim 9, wherein the position detecting sensor comprises a first position detecting sensor, the first position detecting sensor being at a location corresponding to one end portion of each of the plurality of auxiliary film layers in the X direction and configured to detect a position of each of the plurality of auxiliary film layers in the X direction.

11. The resin molding apparatus of claim 10, wherein the position detecting sensor comprises a second position detecting sensor, the second position detecting sensor being at a location corresponding to one end portion of each of the plurality of auxiliary film layers in the Y direction and configured to detect a position of each of the plurality of auxiliary film layers in the Y direction.

12. The resin molding apparatus of claim 9, wherein the release film feeder further comprises a reject mark detecting sensor configured to detect a reject mark, the reject mark detecting sensor being on the support table.

13. The resin molding apparatus of claim 12, wherein the reject mark detecting sensor is positioned corresponding to a portion of the release function layer that is exposed between the plurality of auxiliary film layers.

14. The resin molding apparatus of claim 9, wherein the release film feeder further comprises:

a consumption amount measuring sensor adjacent to the feeding roller, and configured to detect a consumption amount of the release film of the multilayer structure; and a defect detecting sensor configured to detect whether the release film is defective, the defect detecting sensor being between the feeding roller and the support table.

15. A resin molding apparatus comprising:

a resin material feeder configured to feed a resin to a chip type element on a substrate, the resin material feeder including a release film feeding mechanism including a support table and configured to feed a release film onto the support table, a resin material receiving frame, and a resin material conveying mechanism, the support table configured to horizontally move in X and Y directions that are parallel to a surface of the support table, the resin material receiving frame to which the release film is attached and configured to receive a resin material, the resin material conveying mechanism configured to convey the resin material receiving frame having the release film attached thereto to a mold;

the mold including an upper mold part and a lower mold part, the mold configured to receive the resin between the upper mold part and the lower mold part and mold the chip type element on the substrate;

a position detecting sensor configured to detect a position of the release film, the position detecting sensor on the support table; and a controller configured to control the resin material feeder and the mold, wherein the release film comprises a multilayer structure including a stack of a release function layer and a plurality of auxiliary layers spaced apart from each other on the release function layer.

16. The resin molding apparatus of claim 15, wherein the position detecting sensor comprises a first position detecting sensor configured to detect a position of the release film in the X direction, and the controller is further configured to control a movement position of the release film in the X direction based on the position of the release film detected by the first position detecting sensor.

17. The resin molding apparatus of claim 16, wherein
the position detecting sensor comprises a second position detecting sensor configured to detect a position of the release film in the Y direction, and
wherein the controller is further configured to control a movement position of the release film in the X direction based on the position of the release film detected by the second position detecting sensor.

18. The resin molding apparatus of claim 15, wherein the release film is configured as a single layer including a release function layer.

19. The resin molding apparatus of claim 15, wherein
the plurality of auxiliary film layers are spaced apart from each other at regular intervals on the release function layer,
the release film feeding apparatus further includes a reject mark detecting sensor on the support table, the reject mark detecting sensor configured to sense a reject mark indicating a defect on the plurality of auxiliary film layers, and
the controller is further configured to selectively use or reject the release film according to a sensing result of the reject mark detecting sensor.

20. The resin molding apparatus of claim 19, wherein the position detecting sensor is at a location corresponding to one end portion of each of the plurality of auxiliary film layers in the X and Y directions and is configured to detect a position of each of the plurality of auxiliary film layers in the X and Y directions.

* * * * *